(12) United States Patent
Chuang et al.

(10) Patent No.: US 11,982,937 B2
(45) Date of Patent: May 14, 2024

(54) RETICLE POD PROVIDED WITH OPTICALLY IDENTIFIABLE MARKS AND METHOD FOR IDENTIFYING THE SAME

(71) Applicant: GUDENG PRECISION INDUSTRIAL CO., LTD., New Taipei (TW)

(72) Inventors: Chia-Ho Chuang, New Taipei (TW); Hsing-Min Wen, New Taipei (TW); Yi-Hsuan Lee, New Taipei (TW); Hsin-Min Hsueh, New Taipei (TW); Ming-Chien Chiu, New Taipei (TW)

(73) Assignee: GUDENG PRECISION INDUSTRIAL CO., LTD., New Taipei (TW)

(*) Notice: Subject to any disclaimer, the term of this patent is extended or adjusted under 35 U.S.C. 154(b) by 216 days.

(21) Appl. No.: 17/146,732

(22) Filed: Jan. 12, 2021

(65) Prior Publication Data
US 2021/0357601 A1 Nov. 18, 2021

Related U.S. Application Data

(60) Provisional application No. 63/024,595, filed on May 14, 2020.

(51) Int. Cl.
| *G03F 1/66* | (2012.01) |
| *B65D 81/24* | (2006.01) |
| *B65D 85/30* | (2006.01) |
| *G03F 1/22* | (2012.01) |
| *G03F 7/00* | (2006.01) |
| *G06K 7/14* | (2006.01) |
| *H01L 21/67* | (2006.01) |
| *H01L 21/673* | (2006.01) |

(52) U.S. Cl.
CPC ............ *G03F 1/66* (2013.01); *B65D 81/24* (2013.01); *B65D 85/30* (2013.01); *G03F 1/22* (2013.01); *G03F 7/70741* (2013.01); *G06K 7/14* (2013.01); *H01L 21/67294* (2013.01); *H01L 21/67353* (2013.01); *H01L 21/67359* (2013.01); *H01L 21/67366* (2013.01); *H01L 21/67376* (2013.01); *H01L 21/67386* (2013.01)

(58) Field of Classification Search
CPC ....... G03F 1/66; G06K 7/14; H01L 21/67294; H01L 21/67359; H01L 21/67366; H01L 21/67386
See application file for complete search history.

(56) References Cited

U.S. PATENT DOCUMENTS 7,808,616 B2 * 10/2010 Yamamoto .......... G03F 7/70741
355/75
8,207,504 B2 * 6/2012 Braude .................. B82Y 10/00
250/372

(Continued)

*Primary Examiner* — J. Gregory Pickett
*Assistant Examiner* — Jenine Pagan
(74) *Attorney, Agent, or Firm* — Locke Lord LLP; Tim Tingkang Xia, Esq.

(57) ABSTRACT

The invention discloses a reticle pod including a base and a lid mounted to the base. The base has a bottom surface having at least one first mark and at least one second mark. The first mark has a first reflectivity relative to a light source, and the second mark has a second reflectivity relative to the light source. The first reflectivity is different from the second reflectivity, and both are also different from that of the rest area of the bottom surface.

8 Claims, 3 Drawing Sheets

(56) References Cited

U.S. PATENT DOCUMENTS

| | | | |
|---|---|---|---|
| 2009/0245981 A1* | 10/2009 | Miyajima | H01L 21/67373 220/377 |
| 2016/0085144 A1* | 3/2016 | Chen | G03F 1/66 430/5 |
| 2020/0035528 A1* | 1/2020 | Chin | G03F 1/38 |

* cited by examiner

US 11,982,937 B2

RETICLE POD PROVIDED WITH OPTICALLY IDENTIFIABLE MARKS AND METHOD FOR IDENTIFYING THE SAME

CROSS-REFERENCE TO RELATED PATENT APPLICATION

This non-provisional application claims priority to and the benefit of, pursuant to 35 U.S.C. § 119(e), U.S. provisional patent application Ser. No. 63/024,595 filed May 14, 2020. The disclosure of the above application is incorporated herein in its entirety by reference.

FIELD OF THE INVENTION

The present disclosure relates to a reticle pod, particularly to a reticle pod with optically identifiable marks provided on a periphery thereof and a method for identifying the marks on the reticle pod.

DESCRIPTION OF THE PRIOR ART

In terms of opening mechanism, reticle pod can generally be classified into a type provided with front opening mechanism and another type provided with top opening mechanism respectively. However, regardless of types of the reticle pods, a reticle pod must be correctly and precisely placed in the platform of a processing apparatus (e.g. apparatus carrying out yellow light lithography process) to ensure the reticle pod can be successfully opened in the platform without any path offset and location displacement in the whole process.

A public patent reference, issued as the patent number TWM496146, discloses an EUV (Extreme Ultraviolet) reticle pod provided with marks, which includes a pod and at least one mark provided on a body of the pod, and said mark is formed by laser engraving manner. The mark has a reflectivity relative to a laser beam. Accordingly, a platform of a process apparatus may be loaded with laser detection approach to thereby identify an orientation of the reticle pod with respect to the platform. Specifically, the platform may be configured to provide a laser beam hitting on said mark and receive a reflected laser beam from the mark to confirm whether the reticle pod locates at a required position.

In view of the conventional and future semiconductor processing apparatus that may contain such laser detection or optical detection, there is a demand to develop reticle pods provided with optically identifiable marks in order to meet or create a variety of requirements in various processes.

SUMMARY OF THE INVENTION

An objective of the invention is to provides a reticle pod including a base and a lid engaging with the base. The base has a bottom surface that is provided with at least one first mark and at least one second mark, the first mark has a first reflectivity relative to a light source, the second mark has a second reflectivity relative to the light source, and the first reflectivity is different from the second reflectivity.

In one embodiment, the at least one mark locates on a central axial of the bottom surface, the second mark locates on one side of the bottom surface defined by the central axial.

In one embodiment, the bottom surface has a lateral axial perpendicular to the central axial and dividing the bottom surface into a first area and a second area, the at least one first mark locates on a cross of the central axial and the lateral axial, the second mark locates in the second area.

In one embodiment, the first mark is a circular mark, the second mark is a circular mark, and a diameter of the first mark is larger than that of the second mark.

In one embodiment, a center of the second mark and the central axial define a lateral offset distance, the center of the second mark and the lateral axial define a vertical offset distance, and the lateral offset distance is less than the vertical offset distance.

In one embodiment, the lateral offset distance is 18 mm, the vertical offset distance is 58 mm.

In one embodiment, the light source is a laser beam with specific wavelength.

In one embodiment, the at least one first mark has a first surface roughness, the at least one second mark has a second surface roughness different from the first surface roughness, both of the first surface roughness and the second surface roughness are different from that of other areas on the bottom surface.

Another objective of the invention is to provide a method for identifying a reticle pod that includes a base having a bottom surface provided with at least one first mark and at least one second mark. The first mark has a first reflectivity relative to a light source, the second mark has a second reflectivity relative to the light source, the first reflectivity is different from the second reflectivity. The method includes: placing the reticle pod on a processing platform provided with multiple probe lights; projecting the probe lights onto the at least one first mark and the at least one second mark respectively; and receiving a first reflected light from the at least one first mark and a second reflected light from the at least one second mark, and accordingly generating at least one first message and at least one second message, wherein the first message indicates whether the reticle pod is placed in correct location, the at least one second message indicates an identification of the reticle pod.

In one embodiment, the probe lights are laser beams with specific wavelength.

In one embodiment, the method further includes receiving at least one first voltage value corresponding to the at least one first reflected light and at least one second voltage value corresponding to the at least one second reflected light, the at least one first voltage value being different from the at least one second voltage value.

In one embodiment, the at least one first voltage value is from 4.8 to 5.2 V, the at least one second voltage value is less than 4.0 V.

In one embodiment, said identification includes a model or a version of the reticle pod or a reticle.

Yet another objective of the invention is to provide a method for identifying reticle pod. The method includes providing at least one first mark and at least one second mark on a bottom surface of a base of a reticle pod, the first mark having a first reflectivity relative to a light source, the second mark having a second reflectivity relative to the light source, and the first reflectivity being different from the second reflectivity, wherein the second reflectivity is associated with an identification of the reticle pod; placing the reticle pod on a processing platform provided with multiple probe lights; projecting the probe lights onto the at least one first mark and the at least one second mark; and receiving a first reflected light from the at least one first mark and a second reflected light from the at least one second mark, and generating at least one first message and at least one second message, wherein the at least one message indicates whether the reticle pod is placed at correct location while the at least one second message indicates the identification of the reticle pod.

In one embodiment, the at least one first mark and the at least one second mark are formed on the bottom surface of the base by laser engraving manner.

BRIEF DESCRIPTION OF THE DRAWINGS

The present invention can be understood more thoroughly with reference to the accompanying drawings and the descriptions given below. Various examples, which are not intended to be limiting and exhaustive, will be described with reference to the drawings. The elements shown in the drawings are not necessarily illustrated to actual scale for the purpose of explaining the structures and relevant principles.

DETAILED DESCRIPTION OF THE PREFERRED EMBODIMENTS

A more complete description of the present invention is provided below with reference to the accompanying drawings, and examples are provided to demonstrate exemplary embodiments. Nevertheless, the claimed subject matter of the present invention can be implemented in various forms, and therefore the construction of the covered or claimed subject matters shall not be limited to any exemplary embodiment disclosed in this description; the exemplary embodiments are merely provided as examples. Likewise, the present invention is intended to provide a reasonably broad scope for the claimed or covered subject matters. Besides, for example, a claimed subject matter may be implemented as a method, device, or system. Therefore, a specific embodiment may be in the form of, for example, hardware, software, firmware, or any combination (known to be non-software) thereof.

The term "an embodiment" used in this description does not necessarily refer to exactly the same embodiment, and the term "other (some/certain) embodiments" used in this description does not necessarily refer to different embodiments. The purpose of this description is to explain the claimed subject matter using examples that include combinations of all or part of the exemplary embodiments.

Figure 1:
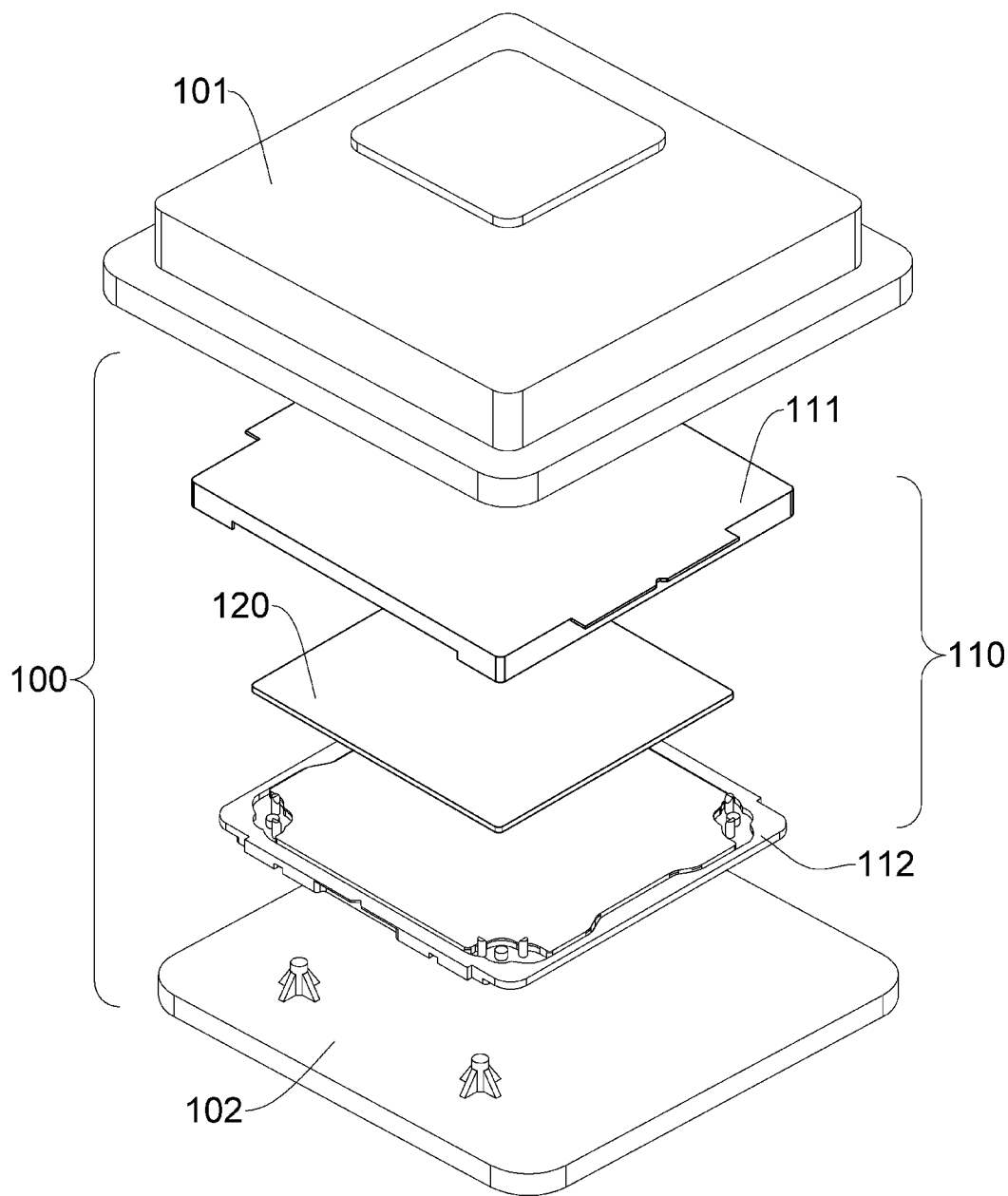
FIG. 1 is an exploded view of a reticle pod.

FIG. 1 illustrates an exploded view of a reticle pod, which can be a EUV reticle pod, including an outer pod (100) and an inner pod (110). The outer pod (100) has a lid (101) and a base (102) which are able to combine with each other to accommodate the inner pod (110). The inner pod (110) has a lid (111) and a base (112), and configured to accommodate a reticle (120).

The outer pod (100) and the inner pod (110) may have more details which are omitted, only content relevant to the present invention will be described. Although not specifically shown and described, one person skilled in the art may predict that, in some configurations, an inside of lid (101) of outer pod (100) may be provided with plural restricting pins, the base (102) may be provided with exhaust valves, and the lid (111) of the inner pod (110) may be provided with a filter channel.

Figure 2:
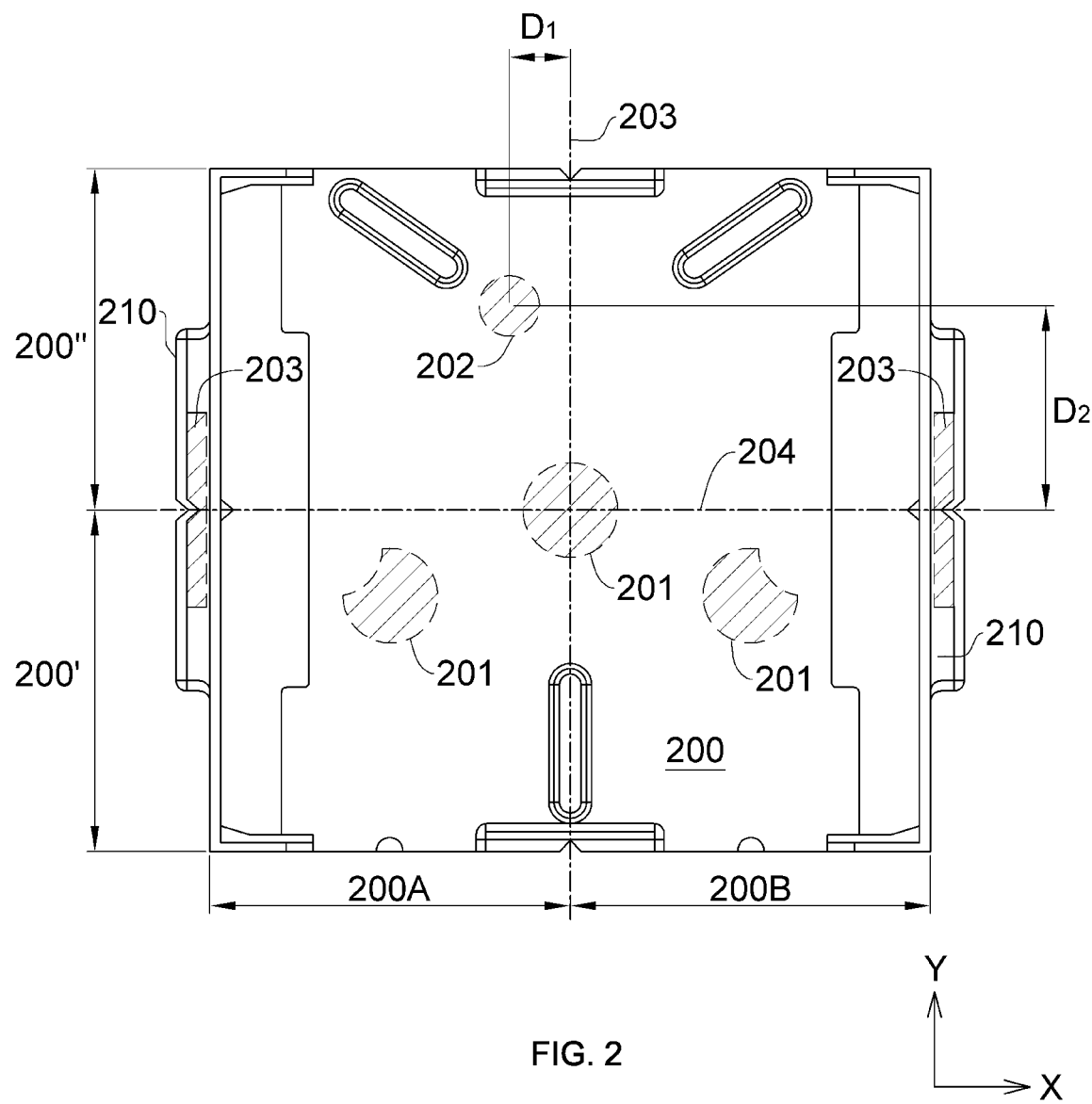
FIG. 2 is a bottom view of a reticle pod in accordance with the present invention.

FIG. 2 illustrates a bottom view of a reticle pod according to the present invention. More specifically, this is a bottom view of an inner pod of the reticle pod, which has been simplified to show a bottom surface (200) of the inner pod and a pair of holding members (210) that belongs to a corresponding lid. The pair of holding members (210) can be held by hands and lifted from the base to expose the reticle. In the case where the reticle pod is placed on a platform of a processing apparatus, the bottom surface (200) will contact with or couple to a carrying interface of the platform. Some types of platforms provide multiple probe light sources and corresponding reading units, which are used to achieve optical-based measurement and identification.

A plurality of marks adaptive for said optical identification are provided on the bottom surface (200) of the base according to the present invention. In the embodiment as shown, the bottom surface (200) is provided with three first marks (201) and a second mark (202). Said first mark (201) is used to check a levelness of the base (112) when placed on a platform. Said second mark (202) is used to check information (e.g. version) pertaining to the reticle pod. One of these first marks (201) generally locates at a center of the bottom surface (200), more specifically, at a central axial (203) along the Y direction and dividing the bottom surface (200) into two symmetrical halves (200A, 200B).

The first mark (201) on the central axial (203) further defines a lateral axial (204) along the X direction, the lateral axial (204) is perpendicular to the central axial (203). The lateral axial (204) further divides the bottom surface (200) into a first area (200') and a second area (200"). In addition to the first mark (201) on the central axial (203), other two first marks (201) both locates within the first area (200') but within respect halves (200A, 200B). As shown, a lateral offset distance is defined by the first marks (201) located in respect halves (200A, 200B) and the central axial (203) while a vertical offset distance is defined by the first marks (201) located in respect halves (200A, 200B) and the lateral axial, wherein the lateral offset distance is larger than the vertical offset distance. In other words, the first marks (201) located in respect two halves (200A, 200B) are more adjacent to the lateral axial (204) rather than the vertical axial (203).

The second mark (202) locates in the half (200A) of the second area (200") of the bottom surface (200). A center of the second mark (202) and the central axial (203) define a lateral offset distance (D1). The center of the second mark (202) and the vertical axial (204) define a vertical offset distance (D2). D1 is less than D2. As such, the second mark is relatively adjacent to the central axial (203), and the second mark (202) is relatively adjacent to the first mark (201) of the center axial (203).

In the embodiment as shown, the first marks (201) and the second mark (202) are generally in circular shape, and a diameter of the second mark (202) is less than that of the first mark (201). It should be realized that the bottom surface (200) is not a complete flat surface in practice. In order to avoid structural interference, the first marks (201) and the second marks (202) may be cut into incomplete circular shape. Alternatively, the first marks (201) and the second mark (202) may locate at different levels due to the incomplete flat surface, but can be observed in the circular shape from a bottom view.

In one embodiment, the first mark (201) on the central axial (203) may locate at a center of the bottom surface (200), such that the central axial (203) and the lateral axial (204) passing through the first mark (201) divide the bottom surface (200) into equal halves (200A, 200B) and into equal areas of the first area (200') and the second area (200"). Preferably, the second mark (202) is a circular shape with a 16 mm diameter or a diameter greater than that. A lateral offset distance (D1) between a center of the second mark (202) and the central axial (203) is 18 mm while a vertical offset distance (D2) between the center of the second mark (202) and the lateral axial (204) is 58 mm.

Nevertheless, the shape and coverage of the second mark (202) is not limited by the drawing. In possible embodiments, the coverage of second mark (202) may include the two halves (200A, 200B) of the second area (200"), or may include the first and second areas (200', 200").

Said first mark (201) and second mark (202) are formed on the bottom surface (200) by specific surface processing, and said surface processing gives the first mark (201) and the second mark (202) a first optical reflectivity and a second optical reflectivity, respectively. It should be realized that said "reflectivity" according to the invention directs to an optical reflectivity relative to a specific light source (e.g. a laser beam with specific wavelength). In the case where the base of the inner pod is made of metal, the first marks (201) and the second mark (202) are formed by laser surface processing, or by chemical reaction applied to the metal surface. The first marks (201) and the second mark (202) can even be made by attaching films of other materials onto the metal surface. Therefore, the first reflectivity of first marks (201) and the second reflectivity of second mark (202) are different from the reflectivity of the bottom surface (200) of the base.

More specifically, said mark may be a TLSM (silver matt pet label stock) or other stickers of other material and color. Alternatively, metal materials such as silver, aluminum or copper can be attached to a predetermined area of the mark by manners like electrical plating, vaporizing, electroless plating, brazing, embedding and ultrasonic fusion to create a relatively higher or lower reflectivity. Coating containing carbon nanotube may be applied to the target surface so as to obtained a reduced mark reflectivity.

Reflectivity difference can be observed by projecting a laser beam with specific wavelength onto the first marks (201), the second mark (202) and other area of the bottom surface (200) respectively and receiving the reflected values in corresponding reflection directions. For example, projecting a laser beam with a certain power value onto the first mark (201) and measuring the power value of a reflected laser beam in the reflection direction; and if the measured power value is 60% of the projecting laser, the first mark (201) has a 60% reflectivity with respect to the light source. In processing apparatus, the read value of reflected light can be converted into a voltage value that depends on different mark reflectivity.

In one embodiment, said reflectivity of mark is determined by a surface roughness thereof. The foregoing laser surface processing is to roughening the original surface of the base, which causes an irregular reflection when the probe light source provided by the platform hits the roughen surface so as to reduce the reflection toward its reflection direction. For example, the first mark (201) and the second mark (202) respectively has a first surface roughness and a second surface roughness, and the first surface roughness and the second surface roughness are significantly different with each other, also with other area of the bottom surface. To avoid the reflected lights respectively from the first marks (201) and the second mark (202) from interfering with each other and affecting the read value, the second mark (202) and the first mark (201) on the central axial (203) according to the present invention have a particular relationship which ensures the reflected lights do not interfere with each other when read by the platform.

In some embodiments, additional third marks (203) may be provided on downward surfaces of the pair of the holding members (210), which may assist the platform to identify whether a lid exists above the base or orientation of the lid.

Figure 3A:
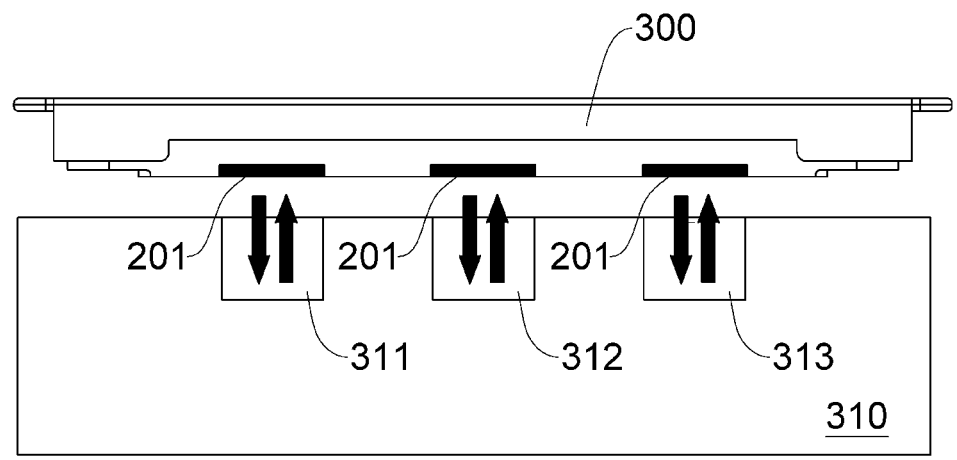
FIGS. 3A and 3B respectively illustrate a reticle pod in accordance with the present invention on a platform of a processing apparatus with plural marks and their corresponding detection light sources.
Figure 3B:
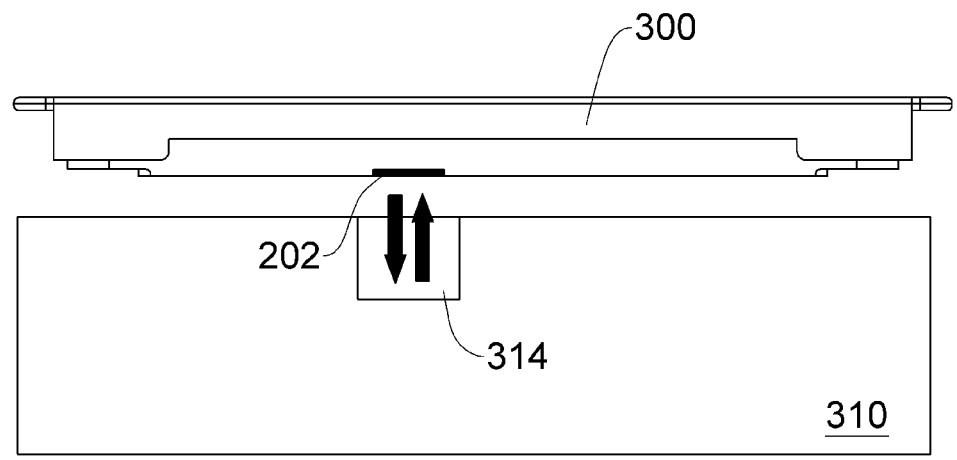

The present invention further provides a method for identifying reticle pod, wherein said reticle pod is provided with said first marks (201) and second mark (202). With reference to FIGS. 3A and 3B, which schematically show said reticle pod is placed above a carrying surface of a processing platform (310). The method includes placing said reticle pod onto the processing platform (310) having multiple probe light sources (311, 312, 313, 314), wherein the probe light sources are laser light sources with specific wavelength, and each of the probe light sources further includes an optical detector.

The method includes projecting probe lights from the probe light sources (311, 312, 313, 314) onto the first marks (201) and the second mark (202) respectively. As shown in the figure, the probe light sources (311, 312, 313, 314) are arranged to correspond to the first marks (201) and the second mark (202). In practice, the probe light can be configured to obliquely hit the mark, and then the reflected light can be obliquely as well. In some embodiments, the probe light sources (311, 312, 313, 314) project the probe lights onto these marks via light guide assemblies. These probe light sources (311, 312, 313, 314) may have identical optical parameters. Alternatively, probe light sources (311, 312, 313) corresponding to the first marks (201) may have a configuration different from that of the probe light source (314) corresponding to the second mark (202).

The method includes receiving, by the platform (310), first reflected lights from the first marks (201) and a second reflected light from the second mark (202), and accordingly generating a first message and a second message. For example, the platform is capable of converting the reflected light into a voltage value, by which a first reflected light corresponds to a first voltage value while a second reflected light corresponds to a second voltage value. The first voltage value is generally different from the second voltage value due to the reflectivity difference between the first mark (201) and the second mark (202).

In the case where optical detectors reads the respective first voltage values regarding the first marks (201) and the respective first voltage values fall within a predetermined range, then said first message indicates the reticle pod is placed at the correct location. In the case where an optical detector reads a second voltage value regarding the second mark (202) and the second voltage value falls within a predetermined range, then said second message can indicate an identification of the reticle pod. For example, a predetermined range of the first voltage value with respect to the first mark (201) is 4.8 to 5.2 V, a predetermined range of the second voltage value with respect to the second mark (202) is less than 4.0 V (not zero). Said "message" is a detection result sent out by the platform.

Said identification includes indication of reticle pod model or version. For example, the platform may associate the detected second voltage value with a predetermined reticle pod identity list that is stored in a storage accessible by the platform and includes information regarding reticle pod (e.g. model or version) or reticle with respect to the second voltage value.

In view of the foregoing embodiment description, the present invention discloses a reticle pod whose information is identifiable by machine platform and a method for identifying such reticle pod, so that processing apparatus that is provided with laser detection manner can further provide reticle pod information identification, improving data manipulation in manufacturing process.

What is claimed is:

1. A reticle pod including a base and a lid engaging with the base, characterized in that:

the base has a bottom surface that is provided with at least one first mark and at least one second mark, the first mark has a first reflectivity relative to a light source, the second mark has a second reflectivity relative to the light source, and the first reflectivity is different from the second reflectivity, wherein the at least one first mark having the first reflectivity is configured to reflect the light source in order to generate a first voltage value, and the at least one second mark having the second reflectivity is configured to reflect the light source in order to generate a second voltage value, wherein the first voltage value and the second voltage value are substantially distinct in order to respectively associate with a first message and a second message distinct from the first message.

2. The reticle pod as claimed in claim 1, wherein the at least one first mark locates on a central axial of the bottom surface, the second mark locates on one side of the bottom surface defined by the central axial.

3. The reticle pod as claimed in claim 2, wherein the bottom surface has a lateral axial perpendicular to the central axial and dividing the bottom surface into a first area and a second area, the at least one first mark locates on a cross of the central axial and the lateral axial, the second mark locates in the second area.

4. The reticle pod as claimed in claim 3, wherein the first mark is a circular mark, the second mark is a circular mark, and a diameter of the first mark is larger than that of the second mark.

5. The reticle pod as claimed in claim 4, wherein a center of the second mark and the central axial define a lateral offset distance, the center of the second mark and the lateral axial define a vertical offset distance, and the lateral offset distance is less than the vertical offset distance.

6. The reticle pod as claimed in claim 5, wherein the lateral offset distance is 18 mm, the vertical offset distance is 58 mm.

7. The reticle pod as claimed in claim 1, wherein the at least one first mark has a first surface roughness, the at least one second mark has a second surface roughness different from the first surface roughness, both of the first surface roughness and the second surface roughness are different from that of other areas on the bottom surface.

8. The reticle pod as claimed in claim 1, wherein the first reflectivity is different from the second reflectivity so that lights from the light source are able to be reflected by the first mark and the second mark and converted into the first voltage value and the second voltage value respectively by a processing platform receiving the reflected lights, and the first voltage value is different from the second voltage value.

* * * * *